(12) United States Patent
Sawachi

(10) Patent No.: US 7,009,637 B2
(45) Date of Patent: Mar. 7, 2006

(54) PORTABLE MULTI-FUNCTION APPARATUS AND CONTROLLER

(75) Inventor: Youichi Sawachi, Saitama (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 779 days.

(21) Appl. No.: 09/826,863

(22) Filed: Apr. 6, 2001

(65) Prior Publication Data

US 2002/0030744 A1 Mar. 14, 2002

(30) Foreign Application Priority Data

Apr. 7, 2000 (JP) .............................. 2000-107159

(51) Int. Cl.
*H04N 5/232* (2006.01)
(52) U.S. Cl. .................. 348/211.99; 348/375
(58) Field of Classification Search ........... 348/211.99, 348/211.4, 211.1, 211.2, 211.9, 375, 376, 348/373, 239; 386/117; 396/56; 358/906, 358/909.1
See application file for complete search history.

(56) References Cited

U.S. PATENT DOCUMENTS

| | | | | |
|---|---|---|---|---|
| 4,746,993 A | * | 5/1988 | Tada | ............................ 386/107 |
| 5,387,955 A | * | 2/1995 | Cocca | ........................... 396/59 |
| 5,512,947 A | | 4/1996 | Sawachi et al. | |
| 5,790,193 A | * | 8/1998 | Ohmori | ........................ 348/375 |
| 6,141,043 A | * | 11/2000 | Michael et al. | ........... 348/211.2 |
| 6,278,486 B1 | * | 8/2001 | Hieda et al. | ................. 348/239 |

FOREIGN PATENT DOCUMENTS

| | | |
|---|---|---|
| JP | A549000 | 2/1993 |
| JP | A591455 | 4/1993 |
| JP | A652095 | 2/1994 |
| JP | A7326871 | 12/1995 |
| JP | A7326872 | 12/1995 |
| JP | A1051723 | 2/1998 |

* cited by examiner

*Primary Examiner*—David L. Ometz
*Assistant Examiner*—Heather R. Jones
(74) *Attorney, Agent, or Firm*—Birch, Stewart, Kolasch & Birch, LLP

(57) ABSTRACT

A portable multi-function apparatus operable both in a camera operation mode and an audio operation mode, wherein the apparatus comprises a main body; an image capturing section having a lens housed in the main body and being operated in the camera operation mode, the image capturing section comprising an image recording part and a recorded image playback part; an audio data playing section housed in the main body and being operated in the audio operation mode; and a controller engaging with the main body and operatively associating with the image capturing section and with the audio data playing section, the controller comprising at least one common operation member which is operated to perform a first function in the camera operation mode and a second function different from the first function in the audio operation mode.

20 Claims, 11 Drawing Sheets

| COMMON OPERATION MEMBER | AUDIO OPERATION MODE | CAMERA OPERATION MODE |
|---|---|---|
| RELEASE SWITCH | PLAY/STOP/PAUSE | SHUTTER OPERATION |
| ZOOM SWITCH | VOLUME CONTROL (MAX←→MIN) | ZOOM OPERATION (WIDE←→TELE) |
| DATA SELECTION SWITCH | FORWARD/BACK OF NUMBERS | SINGLE FRAME STEP FUNCTION OF PLAYING IMAGES |

FIG. 3

PORTABLE MULTI-FUNCTION APPARATUS AND CONTROLLER

This patent application claims priority from a Japanese patent application No. 2000-107159 filed on Apr. 7, 2000, the contents of which are incorporated herein by reference.

BACKGROUND OF THE INVENTION

1. Field of the Invention

The present invention relates to a portable multi-function apparatus and a controller. More particularly, the present invention relates to a portable multi-function apparatus and controller that may be operable both in a camera operation mode and an audio operation mode.

2. Description of the Related Art

A controller that can be attached to a main body of portable audio equipment has been invented. Japanese Utility Model Application Laid-Open No. H6-52095, Japanese Patent Application Laid-Open No. H7-326871, and Japanese Patent Application Laid-Open No. H7-326872 disclose portable audio equipments with a detachable operation member.

As to portable multi-function apparatus, a type of portable multi-function apparatus loaded with a plurality of memory cards has been invented. Japanese Patent Application Laid-Open No. H10-51723, Japanese Patent Application Laid-Open No. H5-49000, and Japanese Patent Application Laid-Open No. H5-91455 disclose portable multi-function apparatus having a plurality of memory cards.

Moreover, a type of portable multi-function apparatus with audio functions has been invented.

When a controller controls a portable multi-function apparatus with audio functions, both a controlling member for controlling audio functions and a controlling member for controlling portable multi-function apparatus functions are needed. Thus, the size of a controller becomes bigger and uneconomical. Usability also decreases when a controller is attached to a main body. On the other hand, if a plurality of recording media is loaded, user-friendliness of a portable multi-function apparatus with a controller is not considered.

SUMMARY OF THE INVENTION

Therefore, it is an object of the present invention to provide a portable multi-function apparatus and a controller, which is capable of overcoming the above drawbacks accompanying the conventional art. The above and other objects can be achieved by combinations described in the independent claims. The dependent claims define further advantageous and exemplary combinations of the present invention.

According to a first aspect of the present invention, a portable multi-function apparatus having a camera operation mode and an audio operation mode, the apparatus comprises: a main body; an image capturing section in the main body operable in the camera operation mode, the image capturing section comprising an image recording part and a recorded image playback part; an audio data playing section in the main body operable in the audio operation mode; and a controller operatively connectable with the image capturing section and the audio data playing section, the controller comprising at least one common operation member and a second function, different from the first function, in the audio operation mode.

The common operation member may be a release switch operable as a shutter switch in the camera operation mode and as an audio operation switch in the audio operation mode.

The controller may be attachable to the main body, the controller being positioned at an upper right corner of the main body, when viewed from a side of an ocular finder of the main body, when attached to the main body.

The controller may be attachable to the main body, the common operation member of the controller being positioned at a top right position of the main body, when viewed from a side of a finder of the main body, and the common operation member may be operable as a release switch for the camera operation mode when the controller is attached to the main body.

The controller may be attachable to the main body at a position such that, when orientation of the main body is changed, the controller is operable with an operational posture that is same to an operational posture for the controller before the changed orientation of the main body.

The controller may be attachable to the main body so as to be positioned at an upper right position, as viewed from a side of an ocular finder of the main body, when a picture is taken with a shorter side of the main body on top.

The controller may be attachable to the main body and include a headphone terminal, the headphone terminal may be exposed on an outer surface of the controller when the controller is attached to the main body.

The main body may include a controller-detecting section for detecting a loading of the controller.

The controller may automatically switch an operational mode to the camera operation mode when the controller-detecting section detects the loading of the controller, and the controller automatically may switch the operational mode to the audio operation mode when the controller-detecting section does not detect the loading of the controller.

The controller may switch to an exclusive use of the camera operation mode when the controller-detecting section detects the loading of the controller, and the controller may switch to an exclusive use of the audio operation mode when the controller-detecting section does not detect the loading of the controller.

The controller is operatively connected with the image capturing section and the audio data playing section by a wireless connection.

The controller may be operatively connected with the image capturing section and the audio data playing section by a cable connection.

According to a second aspect of the invention, a portable multi-function apparatus operable in a camera operation mode and an audio operation mode, the apparatus comprises: a main body; and a controller operatively connectable with the main body for an audio operation and a camera operation thereof; wherein: the main body includes a detachable first recording medium; and the controller includes a detachable second recording medium.

If the second recording medium is loaded, the second recording medium may be automatically selected and used when the controller is in an audio operation mode and, if the first recording medium is loaded, the first recording medium may be automatically selected and used when the controller is in a camera operation mode.

The data may be transferable between the first recording medium and the second recording medium.

The main body may include a first battery and the controller includes a second battery; and the first battery may charge the second battery with electricity when the controller is loaded on the main body.

According to a third aspect of the invention, a controller for operatively associating with a portable multi-function apparatus, which is operable in a camera operation mode and an audio operation mode, the controller comprises: at least one common operation member operable to perform a first function of the portable multi-function apparatus in the camera operation mode thereof and a second function of the multi-function apparatus, different from the first function, in the audio operation mode thereof; and an operation signal transmitting output connecting to the common operation member.

The controller may further comprise a first recording medium operable in the audio operation mode of the portable multi-function apparatus.

The first recording medium may communicate with a second recording medium installed in the multi-function apparatus to transfer data back and forth.

The controller may further comprise an engaging member, which is detachably engageable with the portable multi-function apparatus.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 illustrates an exemplary diagram showing functions of an audio operation mode and a camera operation mode, which are the common controlling member of the remote controlling unit.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
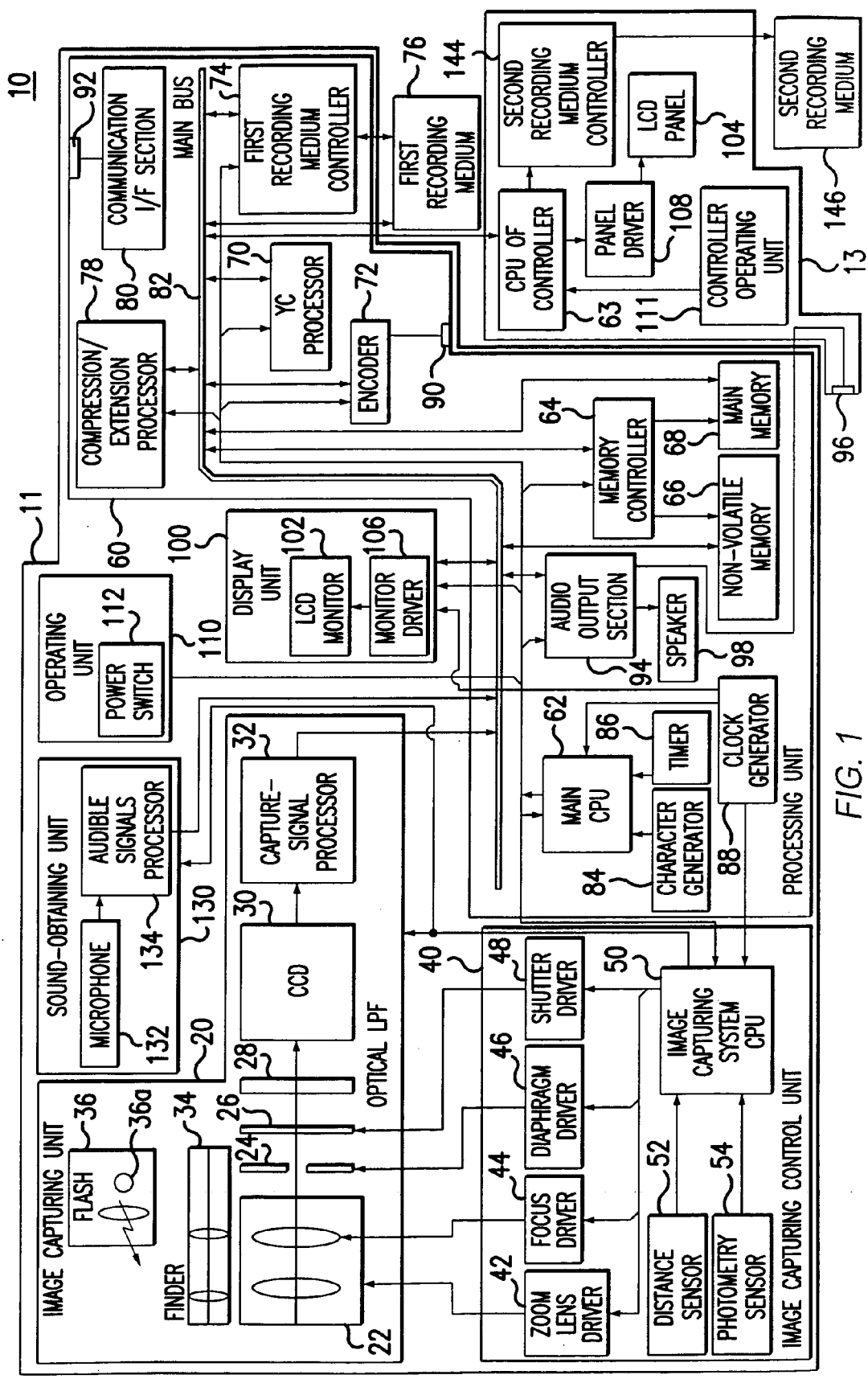
FIG. 1 is a block diagram showing an entire structure of a portable multi-function apparatus according to an embodiment of the present invention.

FIG. 1 is a block diagram depicting an entire structure of a portable multi-function apparatus 10 according to the preferred embodiment of the present invention. The portable multi-function apparatus 10 according to the present embodiment records and reproduces videos (moving pictures) and sound as well as capturing still images. The portable multi-function apparatus 10 includes a main body 11 and a controller 13. The main body 11 includes an image-capturing unit 20, a sound-obtaining unit 130, a control unit 40, a processing unit 60, a display unit 100, and an operating unit of main body 110.

The image-capturing unit 20 includes structural and electrical members pertaining to photographing and image forming. That is, image-capturing unit 20 is provided with a lens section 22, which captures an image and processes the captured image, a diaphragm 24, a shutter 26, an optical LPF or low pass filter 28, a CCD 30, and a capture-signal processor 32. The lens section 22 preferably includes afocus lens and a zoom lens. The structure makes it possible to form an image of an object on the surface of the light reception of the CCD 30. Each sensor element of the CCD 30, though it is not shown in FIG. 1, stores up electric charge (referred to as "stored electric charge" hereinafter). The stored electric charge is taken up with a read gate pulse to a shift register, which is not shown in FIG. 1, and subsequently taken out sequentially with a register transfer pulse as a voltage signal.

Since the portable multi-function apparatus 10 generally has an electric shutter function, a mechanical shutter such as the shutter 26 is not always necessary. A shutter drain is set up in the CCD 30 through a shutter gate in order to achieve the electric shutter function. When the shutter gate is activated, the stored electric charge is drained out to the shutter drain. Controlling the shutter gate may control shutter speed, which is the time to store up the electric charge in each sensor element.

The voltage signal output from the CCD 30, that is, an analog signal, is color-separated by the capture-signal processor 32 into R, G and B elements, and the white balance is adjusted. The capture-signal processor 32 then takes place a gamma correction, sequentially converts the R, G and B signals from analog into digital form by the necessary timing, and outputs the obtained digital image data (referred to as "digital image data" hereinafter) to the processing unit 60.

The image-capturing unit 20 further includes a finder 34 and an electronic flash 36. The finder 34 may be equipped with an LCD, which is not shown in FIG. 1. In that case, the finder 34 displays various pieces of information provided by a main CPU 62 described later. The electronic flash 36 emits light when the energy stored in a capacitor, which is not shown in FIG. 1, is supplied to a discharge tube 36a.

The sound-obtaining unit 130 includes structural members and electrical members for obtaining external sound. The sound-obtaining unit 130 includes a microphone for catching and processing sound and an audible signals processor 134. The audible signal processor 134 sequentially converts the audible signals caught by the microphone 132 from analog to digital at a necessary timing. The audible signal processor 134 then outputs the obtained audio data (referred to as "digital audio data" hereinafter) to the processing unit 60. The audible signal processor 134 may undertake processes such as for reducing noise or adjusting sound levels.

The image capturing control unit 40 includes a zoom lens driver 42, a focus driver 44, a diaphragm driver 46, a shutter driver 48, an image capturing system CPU 50, which controls all of the above-mentioned drivers, a distance sensor 52, and a photometry sensor 54. Each of the drivers such as the zoom lens driver 42 has a driving means such as a stepping motor or the like. In a response to a snap of a release switch 114 described later, the distance sensor 52 gauges the distance defined between the camera and the object, and the photometry sensor 54 measures the brightness of the object. The gauged distance data (referred to as "gauged distance data" hereinafter) and the measured brightness data of the object (referred to as "measured luminance data" hereinafter) are transmitted to the image capturing system CPU 50. The image capturing system CPU 50 controls the zoom lens driver 42 and the focus driver 44 based on the photograph information provided by a user such as the magnification of the zoom lens, and makes adjustments of the magnification of the zoom lens and focus for the lens section 22.

The image capturing system CPU 50 determines an aperture value and a shutter speed, based on the integrated value of digital signals of RGB in one image frame, which is called as AE information. According to the aperture value and the shutter speed thus determined, the diaphragm driver 46 and the shutter driver 48 respectively adjust the amount of aperture and then drive the shutter 26 to open and close.

The processing unit 60 includes a main CPU 62 for controlling the entire portable multi-function apparatus 10, especially the processing unit 60 itself, a memory controller 64, which is controlled by the main CPU 62, a YC processor 70, a first recording medium controller 74, a compression/extension processor 78, a communication interface (I/F) section 80, and an audio output section 94. The main CPU 62 communicates necessary information with the image capturing system CPU 50 by serial communication, for example. A clock generator gives an operating clock of the main CPU 62. The clock generator 88 also provides clocks of different frequencies respectively to the image capturing system CPU 50 and the display unit 100.

The main CPU 62 is also comprised of a character generator 84 and a timer 86. The timer 86 is backed up by batteries and continuously counts the time and date. This count value gives the main CPU 62 information about the time and date of photograph and other time information. The character generator 84 generates character information such as the time and date of photograph or a title. The character information is then appropriately superimposed with a photographic image.

The memory controller 64 controls a non-volatile memory 66 and a main memory 68. The non-volatile memory 66 is comprised of components such as an EEPROM or electrically erasable and programmable read only memory, and a flash memory. The non-volatile memory 66 stores data such as setting information set by a user or an adjustment value before shipment, which should be kept even when the power of the portable multi-function apparatus 10 is turned off. The non-volatile memory 66 may store a boot program or a system program of the main CPU 62 if necessary. On the other hand, the main memory 68 may generally be a relatively inexpensive memory having a large capacity such as a DRAM or dynamic random access memory. The main memory 68 has: a frame memory function, which stores data that is output from the image-capturing unit 20 and the sound-obtaining unit 130; a system memory function, which is loaded with various programs; and a work area function.

The non-volatile memory 66 and the main memory 68 interact data with the components of the inside and outside of the processing unit 60 via a main bus 82.

The YC processor 70 undertakes a Y-to-C conversion on digital image data and generates a luminance signal Y and a chrominance signal B-Y and R-Y. The memory controller 64 temporarily stores the luminance signal and the chrominance signal in the main memory 68. The compression/extension processor 78 sequentially reads the luminance signal and the chrominance signal from the main memory 68. The compression/extension processor then compresses the luminance signal and the chrominance signal. A memory card, which is one kind of the first recording medium 76, writes through the first recording medium controller 74 the compressed data described above (referred to as "compressed data" hereinafter).

The processing unit 60 further includes an encoder 72. The encoder 72 inputs a luminance signal and a chrominance signal. Then, the encoder 72 converts the luminance signal and the chrominance signal into video signals such as National Television System Committee (NTSC) and Phase Alternation by Line (PAL) signals. The encoder 72 outputs the converted video signals through a video output terminal 90. In order to generate a video signal from the data recorded in the first recording medium 76, firstly the data is transmitted to the compression/extension processor 78 through the first recording medium controller 74. Then, the data, which has been subjected to a necessary process by the compression/extension processor 78, is converted into a video signal by the encoder 72.

The communication I/F section 80 controls such as a protocol conversion based on a communication specification for which the portable multi-function apparatus 10 supports, that is, a specification such as USB, RS-232C, or Ethernet, for example. The communication I/F section 80 may be provided with a driver IC if necessary, and communicates through external devices including networks and a connector 92. Other than those standard specifications, the communication I/F section may have a structure that exchanges data, through a particular interface, with an external device such as a printer, a karaoke device, or a game device.

The audio output section 94 undertakes a processing to output the audio data, which is read from the main memory 68 or a first recording medium 76, to outside through a speaker 98 or a later-described headphone connection terminal 96. In particular, such processes as a D/A conversion, an extension, and amplification are undertaken. The main CPU 62 may undertake a part of or all of these processes.

The display unit 100 includes an LCD monitor 102. A monitor driver 106, which is an LCD driver, respectively controls the LCD monitor 102. The LCD monitor 102 may be, for example, a 2-inch monitor, and is set in the back of a camera. The LCD monitor 102 displays object images or reproduction images.

The operating unit 110 includes the main body 11 and a power switch 112 for selecting on and off of the power supply of the controller 13. The operating unit 110 may include apparatuses and electric members, which are necessary for a user to set or instruct the operation or the mode of the operation of the portable multi-function apparatus 10.

The first recording medium controller 74 undertakes a process such as a generation of necessary signals, a logic conversion, or a voltage conversion between the main bus 82 and the first recording medium 76 according to a signal specification recognized by the first recording medium 76 and a bus specification of the main bus 82. When an external memory such as a memory card is connected as the first recording medium 76, reading and writing of data may be undertaken through the same data bus. An external memory controller as an example of the first recording medium controller 74 controls reading and writing of data through the same data bus. The portable multi-function apparatus 10 may support a standard I/O card for PCMCIA-compliant, for example, other than the above-described memory card, as the first recording medium 76. In that case, the first recording medium controller 74 may constitute with a bus controller LSI for PCMCIA-compliant.

(Operation Member)

The controller 13 includes a CPU of operation member 63, a panel driver 108, an LCD panel 104, a second recording medium controller 144, a second recording medium 146, the headphone connection terminal 96, and a later-described operation member-operating unit 111.

The CPU of operation member 63 controls the controller 13. The headphone connection terminal 96 connects a headphone. Audio data output by the audio output section 94 is out put to the headphone through the headphone connection terminal 96.

The panel driver 108 controls the LCD panel 104. The LCD panel 104 may be, for example, a small monochrome LCD. The LCD panel 104 simply displays information such as the image quality described as FINE/NORMAL/BASIC, on/off of the electronic flash, the standard number of possible photographs, the number of pixels, the amount of batteries, the present operational mode (camera operation mode or audio operation mode), magnification of a zoom lens for photographing or reproducing, the present mode (image or music playback (reproduction) mode), the amount of power left in the batteries, and time and date.

The second recording medium controller 144 undertakes a process such as a generation of necessary signals, a logic conversion, or a voltage conversion between the main bus 82 and the second recording medium 146 according to a signal specification recognized by the second recording medium 146 and a bus specification of the main bus 82. When an external memory such as a memory card is connected as the second recording medium 146, reading and writing of data may be undertaken through the same data bus. An external memory controller as an example of the second recording medium controller 144 controls reading and writing of data through the same data bus. The portable multi-function apparatus 10 may support a memory stick other than the above-described memory card, as the second recording medium 146.

The data of the second recording medium 146 and the first recording medium 76 may be transmitted to each other through the main bus 82.

The second recording medium 146 may be smaller in size compared to the first recording medium 76. Then, the size of the controller 13 may become smaller thereby portability may be improved.

The first recording medium 76 may have larger capacity for memory. Thus, backups of data become possible by transferring the data of the second recording medium to the first recording medium.

Figure 2:
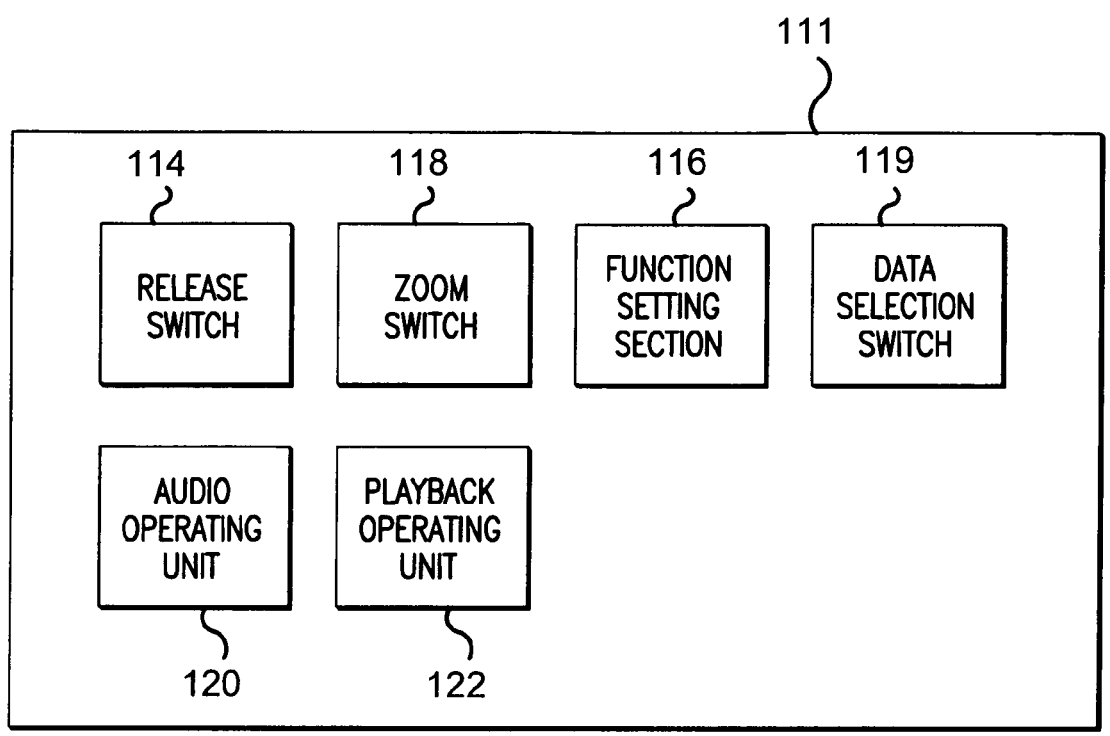
FIG. 2 is a block diagram showing a structure of a controller-operating unit of a controller.

FIG. 2 is a block diagram showing a structure of a controller-operating unit 111 of a controller 13. The controller-operating unit 111 includes apparatuses and electric members, which are necessary for a user to set or instruct the operation or the modes of the main body 11 and the controller 13. The controller 13 makes it possible to operate the camera and the audio. An example of the controller 13 is a remote controller.

The controller-operating unit 111 includes a release switch 114, a zoom switch 118, a function setting section 116, and a data selection switch 119. These switches may function as a common operation member used for different operations respectively as the camera operation mode and the audio operation mode.

The operation made by the controller 13 may be exchanged between the camera operation mode and the audio operation mode by the function setting section 116, which includes a rotary mode dial or a cross key.

For the camera operation mode, the release switch 114 has a two-step structure of switch positions, including two switches to be operated respectively in the two types of position state: the half-position state and the full-position state. For example, the half-position switch undertakes a recording quality adjustment processing, such as an auto focus and an auto exposure. Subsequently, the full-position switch captures data such as an image and audio.

Then, after necessary processes such as signal processing and the compression of data, the captured image will be stored in the main memory 68 or the first recording medium 76. The function setting section 116 may accept a setting such as an image playback mode or an image photograph mode other than the exchanges between the camera operation mode and the audio operation mode. The zoom switch 118 is operated to set the zoom magnification. Examples of an operation or a function include "file format", "special effects", "photographic printing", "confirm/ save", and "display switching", which may be designated by using the remote controlling unit 111. The data selection switch 119 makes it possible to control the playback of audio data for the audio operation mode and to control the playback of video data (moving pictures) for the camera operation mode.

On the other hand, for the audio operation mode, the full-position switch of the release switch 114 undertakes a reproduction of music, and the half-position switch undertakes a pause. The zoom switch 118 is used for adjusting the volume of music. The data selection switch 119 is used for the selection of music numbers.

FIG. 3 illustrates an exemplary diagram showing functions of the audio operation mode and the camera operation mode, which are the common controlling member of the remote controlling unit 111. The release switch 114 has functions of the entire shutting operations for the camera operation mode. For the audio operation mode, the release switch 114 functions as a member for playing, stopping, and pausing music. The zoom switch 118 has functions of zooming operations of photographing images for the camera operation mode. For the audio operation mode, the zoom switch 118 functions as a member for adjusting volume. The data selection switch 119 has a single frame step function of playback images for the camera operation mode. For the audio operation mode, the data selection switch 119 functions as a member for forwarding and rewarding music numbers. Thus, by making the common member control different operations for the camera operation mode and the audio operation mode, the size of the controller 13 becomes smaller thereby portability improves.

The main operations according to the structures described above are as follows.

First, a power switch 112 of the portable multi-function apparatus 10 is turned on. Electric power is then supplied to each part of the camera. The portable multi-function apparatus 10 processes according to the camera operation mode or the audio operation mode, which is set by the function setting section 116.

(The Camera Operation Mode)

If the portable multi-function apparatus 10 is in the still picture photograph mode, the main CPU 62 monitors the half-position state of the release switch 114. When the main CPU 62 detects the half-position state, the main CPU 62 obtains photometry data and distance data from the photometry sensor 54 and the distance sensor 52, respectively. The control unit 40 operates based on the obtained data, and adjustments, such as focus and an aperture of the photographic lens 22, are made. When the adjustments are completed, the main CPU 62 displays letters such as "standby" on the LCD monitor 102 to notify the state to a user.

Then, the main CPU 62 monitors the full-position state of the release switch 114. When the release switch 114 is pressed to the full-position, the shutter 26 is closed after a predetermined shutter time, and the stored electrical charge of the CCD 30 is drained to the image capturing signal processor 32. The digital image data generated by the result of the process undertaken by the image capturing signal processor 32 is output to the main bus 82. The generated digital image data is temporarily stored in the main memory 68. Then, the stored digital image data is processed at the YC processor 70 and the compression/extension processor 78. The processed digital image data is recorded in the first recording medium 76 via the first recording medium controller 74. The recorded digital image data is displayed on the LCD monitor 102 in the frozen state for a period of time. Therefore, a user can check the photographed image. This process completes a series of photographing operations.

If the portable multi-function apparatus 10 is in the still picture play mode, the main CPU 62 reads image data of the picture taken last time from the main memory 68 through the memory controller 64. The main CPU 62 then displays the image on the LCD monitor 102 of the display unit 100. If a user instructs "next" or "back" at the data selection switch 119, a photographed image taken before or after the presently displaying image is displayed on the LCD monitor 102.

If the portable multi-function apparatus 10 is in the animation photograph mode, the main CPU 62 monitors the half-position state of the release switch 114. When the main CPU 62 detects the half-position state, the main CPU undertakes a recording quality adjustment processing as in the still picture photograph mode described above. The main CPU then monitors the full-position state of the release switch 114. When the release switch 114 is pressed to the full-position state, the stored electric charge of the CCD 30 is drained to the image capturing signal processor 32 based on the predetermined synchronized signal. Digital image data is sequentially stored in the first recording medium 76 by undertaking the same processes as in the still picture photograph mode. At the same time, audio data obtained by the audio obtaining unit 130 is sequentially stored in the first recording medium 76. The main CPU 62 monitors the half-position state of the release switch 114 while recording animation. When the main CPU 62 detects the half-position state, the main CPU 62 stops recording animation and audio.

If the portable multi-function apparatus 10 is in the animation (video) play mode or the music play mode, the main CPU 62 reads animation (video) data or audio data from the first recording medium 76 or the second recording medium 146 based on the instruction of a user, which is communicated by the remote controlling unit 111. For animation (video) data, the animation (video) data is given necessary processes at the compression/extension processor 78, the YC processor 70, and the audio output unit 94. The image of the animation data is then displayed on the LCD monitor of the display unit 100. Audio is then output to the headphone connection terminal 96 or the speaker 98.

(The Audio Operation Mode)

When the portable multi-function apparatus is used for playing music the main CPU 62 reads music data from the first recording medium 76 or the second recording medium 146 based on the instructions of a user communicated by the remote controlling unit 111. The audio data is given processes necessary for outputting audio, at the audio output unit 94. The image data is then displayed on the LCD monitor 102 of the display unit 100. Finally, the audio is output to the headphone connection terminal 96 or the speaker 98. A user communicates the instructions, such as "play", "stop", "forward", "reward", "inverse", and "pause," through the release switch 114, the function setting section 116, and the data selection switch 119, the audio operating unit 120, or the animation (video) playback operating unit 122. Thus, a user can play desired data.

Since the portable multi-function apparatus 10 has the common operation member used both for the camera operation and the audio operation, it is preferable to have some alert or notification function to tell or show the user which mode the portable multi-function apparatus is in at the time of its use. The release switch 114 may gleam with light, which is differently used for different operations with different colors. For example, the release switch 114 may have a green light when the portable multi-function apparatus 10 is used as a camera and have a red light when used as an audio player. The alert or notification may be made by a specific sound. The specific sound may sound differently for different operations. The display panel 102 or the LCD panel 104 may display some kinds of notice. The display panel 102 or the LCD panel 104 may also display only black screen to let the user know that the portable multi-function apparatus is in the audio operation mode. Moreover, when the portable multi-function apparatus 10 is in the audio operation mode, it is preferable for the user to not be able to see the view from the finder 34.

Figure 4:
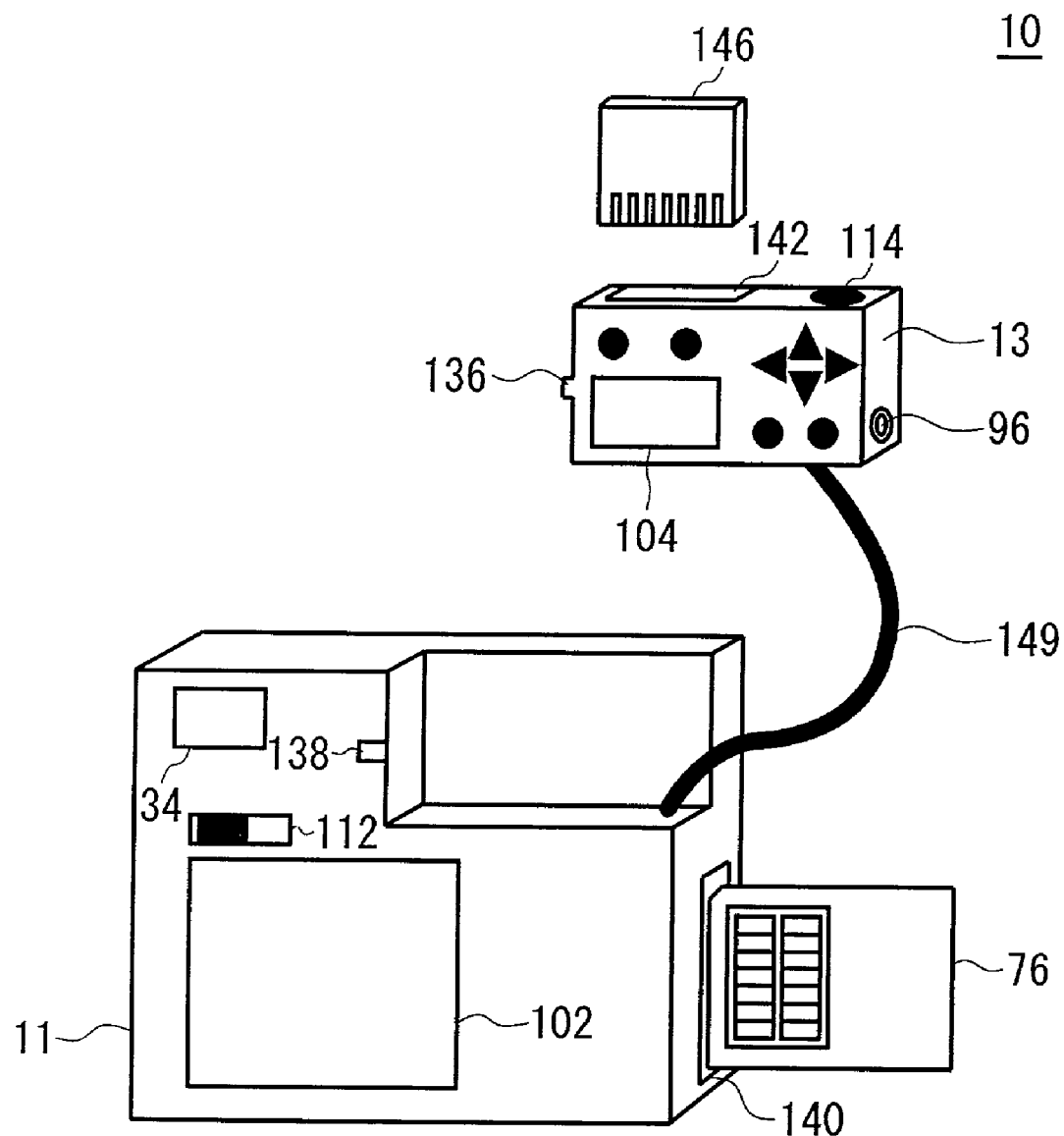
FIG. 4 is a schematic view showing the exterior of the portable multi-function apparatus according to an embodiment of the present invention.

FIG. 4 is a schematic view showing the exterior of the portable multi-function apparatus with audio functions according to the embodiment of the present invention. The portable multi-function apparatus according to the present embodiment is provided with an audio function. The portable multi-function apparatus 10 has the main body 11 and the controller 13. The main body 11 can be operated as an audio player/recorder or a camera by the controller 13. The controller 13 is switchable between the audio operation mode for performing as an audio player/recorder and the camera operation mode for performing as a camera.

The main body 11 includes a main body slot 140 and a controller load-detecting section 138. The first recording medium 76 such as a memory device is inserted into the main body slot 140. The opening of the main body slot 140 is normally closed by a lid (not shown in the drawings). When the first recording medium 76 is inserted into the main body slot 140, the lid is closed so that the first recording medium 76 cannot be directly removed from the outside of the main body 11. Thus, the first recording medium 76 is prevented from being easily removed. In particular, the first recording medium is prevented from being removed while the apparatus accesses the first recording medium to store image data while photographing images.

The controller 13 has a controller slot 142 for inserting the second recording medium 146 and a controller projection 136 used for detecting the loading of the controller 13. When the controller 13 is loaded on the main body 11, the controller projection 136 of the controller 13 comes into engagement with the controller load-detecting section 138 of the main body 11, so that the loading of the controller 13 can be detected. The actual detection may be established by various ways. For example, mechanical switch, electric connection, magnetic connection or the like may be utilized.

The controller 13 is operated to control the operations of the main body 11. The main body 11 and the controller 13 may be connected by the remote controlling cable 149 through which operation signals are transmitted between the main body 11 and the controller 13. The cable 149 connects to an operation signal transmitting output (not shown) of the controller 13. In this case, the controller 13 may be prevented from being lost because the remote controlling cable 149 always connects the controller 13 to the main body 11. On the other hand, the operation signal may be transmitted without through the remote controlling cable 149. In this case, portability excels since a user does not need to care about a cable wiring.

Figure 5:
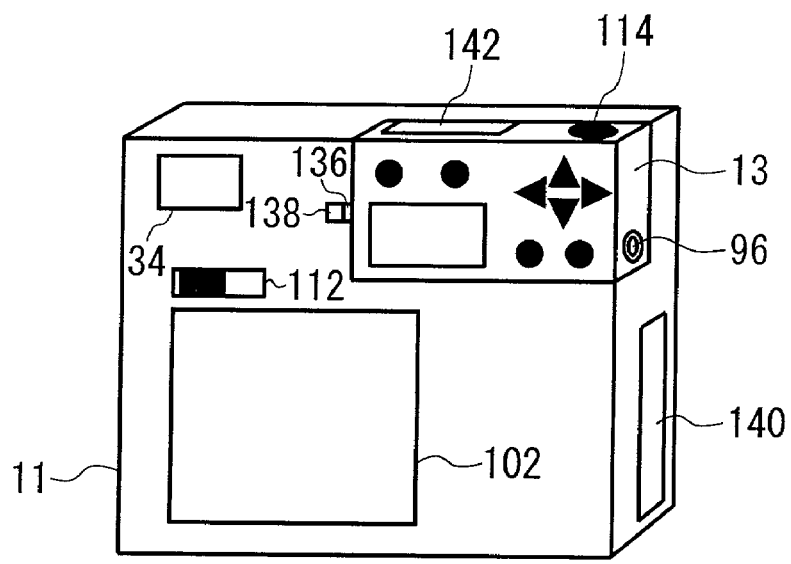
FIG. 5 is a diagram showing a view of a main body with a controller according to an embodiment.

FIG. 5 is a diagram showing a perspective view of a main body 11 with a controller 13 according to an embodiment. The controller 13 is equipped at the position of the upper right corner at the side of the finder 34 of the main body 11. Moreover, the release switch 114 of the controller 13 is placed at the top right from the view of the side of the finder 34. Since the headphone connection terminal 96 is exposed to outside of the apparatus when the controller 13 is equipped to the main body 11, the headphone connection terminal 96 of the controller 13 can be used even if the controller 13 is equipped to the main body 11.

Figure 6:
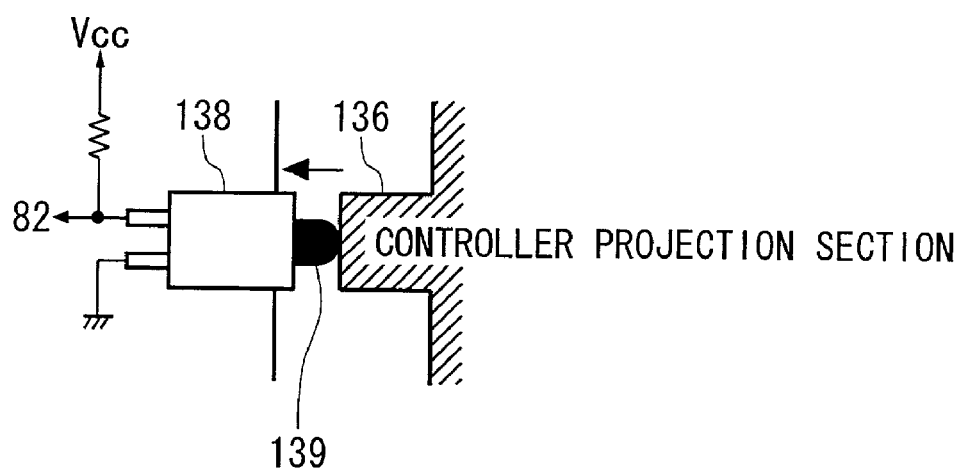
FIG. 6 is a diagram showing a mechanism for detecting a loading of a controller on the main body.

FIG. 6 is an enlarged view showing an example of a mechanism for detecting the loading of a controller 13 on the main body 11. When the controller 13 is equipped on the main body 11, the controller projection 136 of the controller 13 comes into contact with a boss 139 of the controller load-detecting section 138, so that the boss 139 is pushed in the load-detecting section 138 and then a switch installed in the load-detecting section 138 is turned on for detection. When the controller load-detecting section 138 of the main body 11 detects a contact of the controller projection 136 of the controller, which is detected according to the loading of the controller 13, the controller load-detecting section 138 transmits operation member detection signals to the main CPU 62 through the main bus 82 shown in FIG. 1.

Although the afore-mentioned embodiment employs an electrical switch for the detection of the loading of the controller 13, it is not limited thereto or thereby. The detection of the loading of the controller 13 may also be realized by an optical detection method using an optical sensor or a magnetic detection method using a magnet other than the method used in the present embodiment.

Figure 7:
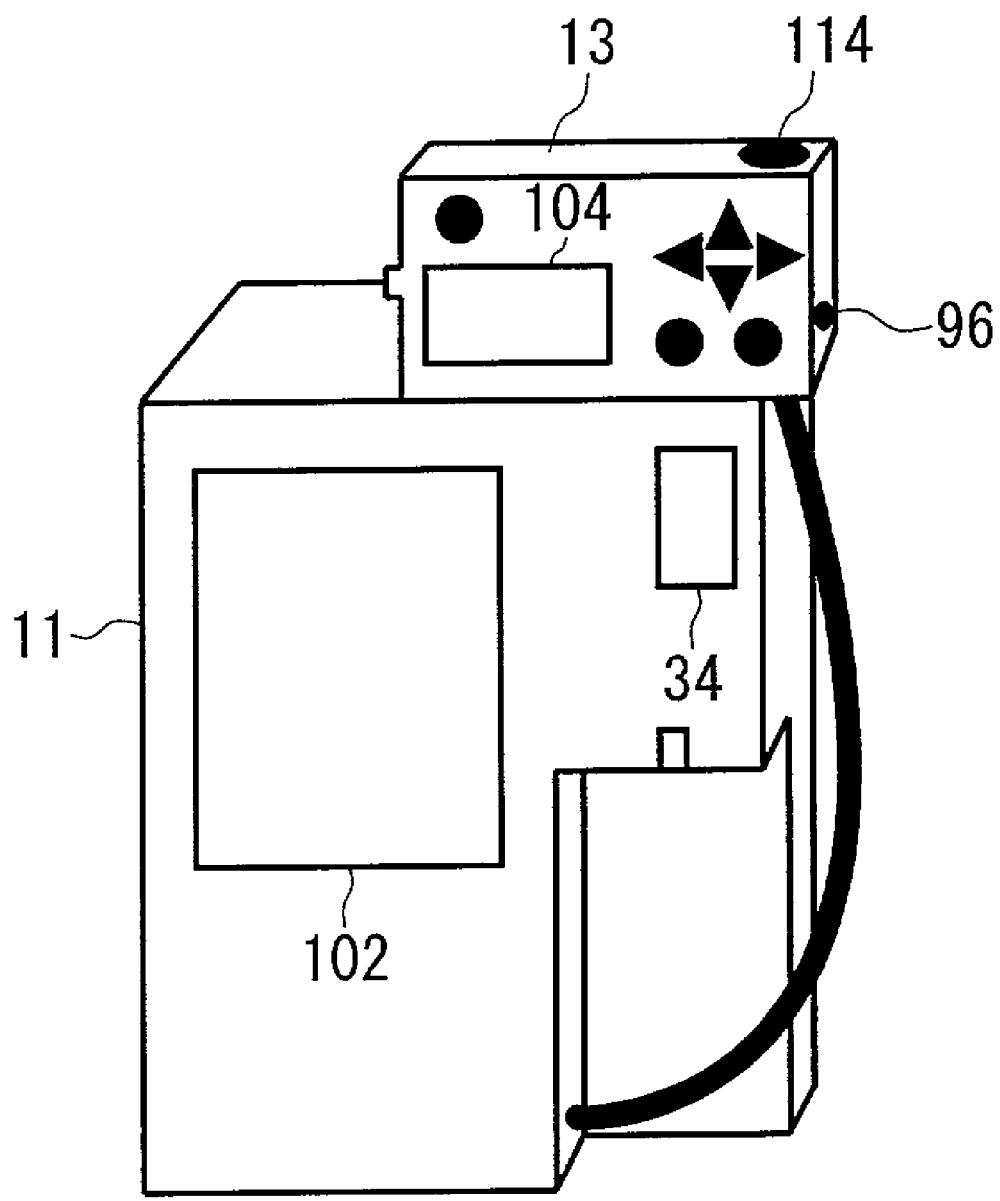
FIG. 7 is a diagram showing a view of a main body with a controller according to another embodiment.

FIG. 7 is a diagram showing a perspective view of the main body 11 with a controller 13 according to another embodiment of the present invention. According to this embodiment, when the main body 11 is in a vertical posture, the controller 13 is detached from a regular position of the main body 11 and mounted at the position of upper right corner of the side of the finder 34 of the main body 11. , In this condition, the release switch 114 of the controller 13 is placed at the top right from the view of the side of the finder 34. When a user desires to take a photograph of vertical posture, the user usually rotates the camera in 90 degrees counterclockwise. In this case, if the position of the release switch 114 is fixed or not flexible with respect to the camera body, the position of photographer's hands and fingers are changed from the usual position. However, according to the present invention, a user may take a photograph with the same position of hands and fingers as that for photographing a regular posture notwithstanding of the direction of the image. Thus, the operativity of photographing improves.

Figure 8:
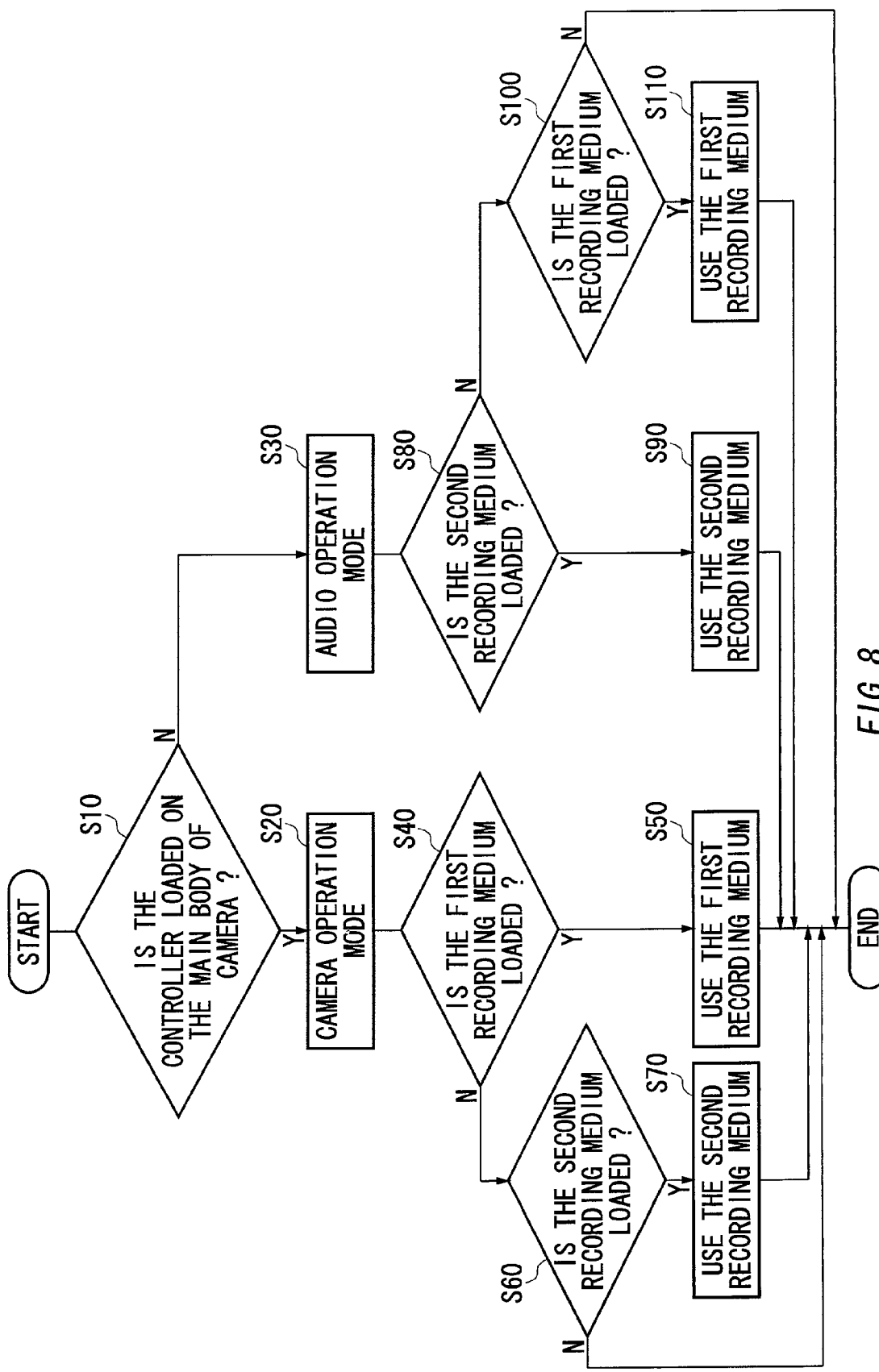
FIG. 8 is a flowchart showing an automatic selection of a controlling mode and an automatic selection of a recording medium.

FIG. 8 is a flowchart showing an automatic selection of a controlling mode and an automatic selection of a recording medium. In the operation, first, it is detected whether the controller 13 is equipped to the main body 11 at a step S10. If the controller load-detecting section 138 detects the controller 13 is equipped to the main body 11, the mode of the portable multi-function apparatus 10 is changed to the camera operation mode at a step S20. If the controller 13 is not equipped to the main body 11, the mode of the portable multi-function apparatus 10 is changed to the audio operation mode at a step S30.

In the camera operation mode, whether the first recording medium 76 is loaded is detected at a step S40. If the first recording medium 76 is loaded, the first recording medium 76 is used for storing data at a step S50. If the first recording medium 76 is not loaded, whether the second recording medium 146 is loaded is detected at a step S60. If the second recording medium 146 is loaded, the second recording medium 146 is used for storing data at a step S70.

On the other hand, in the audio operation mode, it is judged if the second recording medium 146 is loaded at a step S80. If the second recording medium is loaded, the second recording medium is used at a step S90. If the second recording medium in not loaded, whether the first recording medium 76 is loaded is detected at a step S100. If the first recording medium 76 is loaded, the first recording medium 76 is used at a step S110.

Since the portable multi-function apparatus 10 is often used as a camera operation, or the first recording medium 76 of the main body 11 is much used, when the controller 13 is equipped to the main body 11, the operativity improves by the automatic selection of the operational mode and a recording medium as described above. After an operational mode and a recording medium are automatically selected, the operational mode and the recording medium may also be manually selected.

Figure 9:
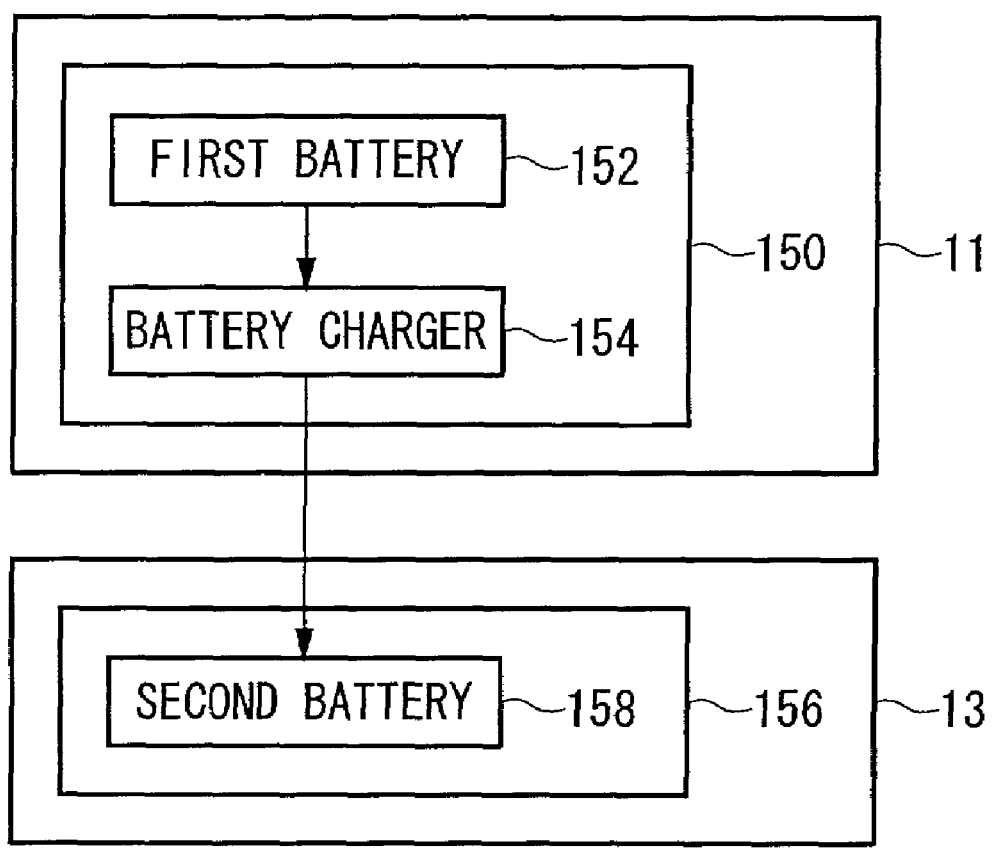
FIG. 9 is a block diagram showing the main body and the outline of a power supply unit of the controller.

FIG. 9 is a schematic block diagram showing the main body 11 and the outline of a power supply unit 150 of the controller 13. The main body 11 has a first power supply unit 150, and the controller 13 has a second power supply unit 156. The first power supply unit 150 includes a first battery 152 and a battery charger 154. The second power supply unit 156 includes a second battery 158. The battery charger 154 supplies power from the first battery 152 to the second battery 158 through the battery charger 154 when the voltage of the second battery 158 is lower than the voltage of the first battery 152.

Thus, since power is supplied to the second battery 158 when the first battery 152 maintains sufficient voltage value even if the voltage of the second battery 158 is not enough, the controller 13 can operate the portable multi-function apparatus 10.

Figure 10:
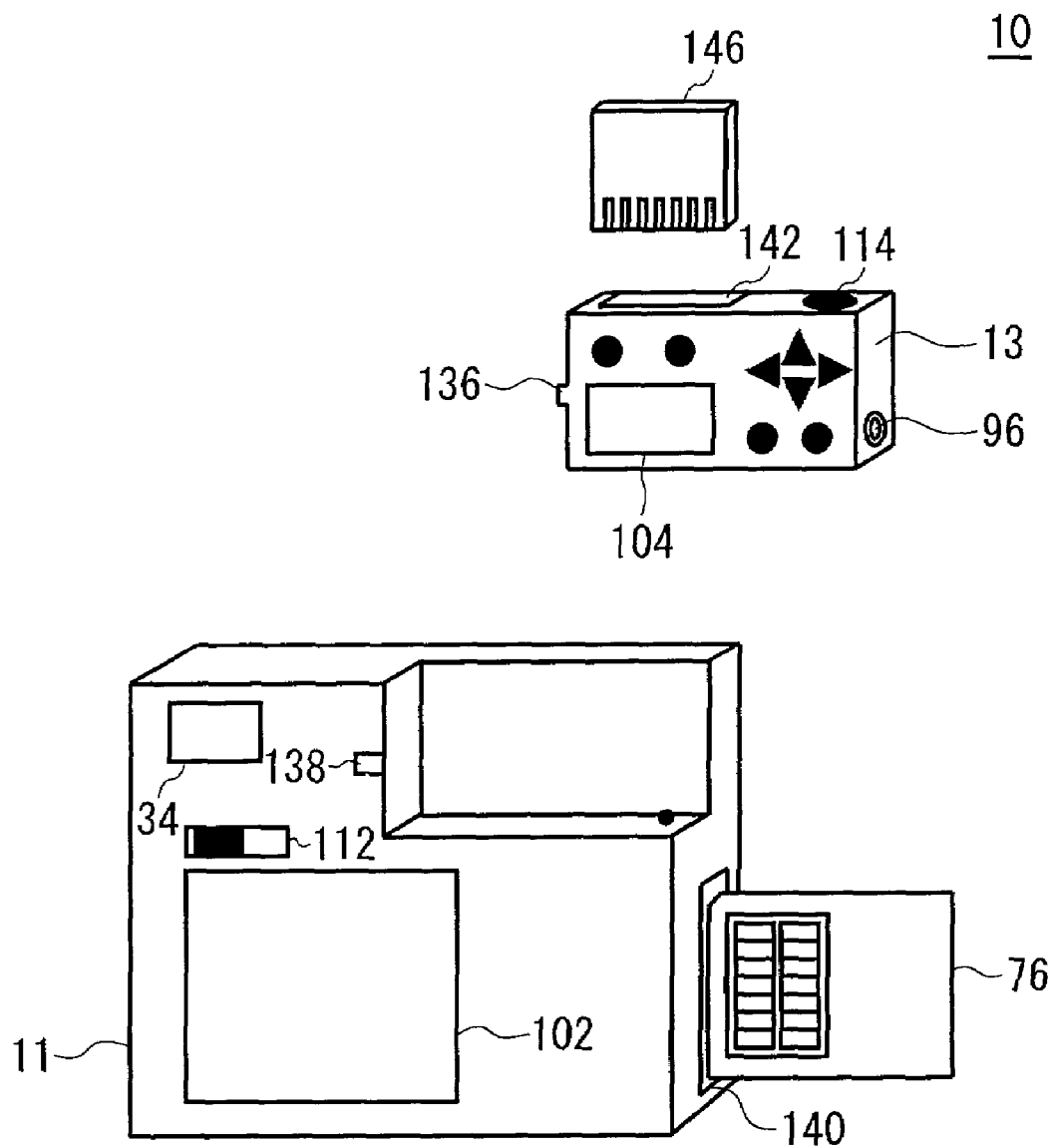
FIG. 10 is a schematic view showing the exterior of the portable multi-function apparatus with a wireless operation member according to an embodiment of the present invention.

FIG. 10 is a schematic perspective view showing the exterior of the portable multi-function apparatus 10 having audio functions with a wireless operation member according to an embodiment of the present invention. The controller 13 performs as a remote controller of the functions of the portable multi-function apparatus. The controller 13 is provided with the headphone connection terminal 96, the second recording medium 146, an LCD panel 104, and the common operation members such as buttons and switches. A user may detach the controller 13 from the multi-function apparatus 10 to listen to music. That is, the user may use the controller 13 as a portable music player. In addition, the controller 13 may also be provided with an operation signal transmitting output connecting to the common operation member though not shown in the figure drawings, so that an operation signal generated as a result of the operation of the common operation members is transmitted to the multi-function apparatus 10. The operation signal may be transmitted to the multi-function apparatus 10 through a wire or wireless.

Figure 11:
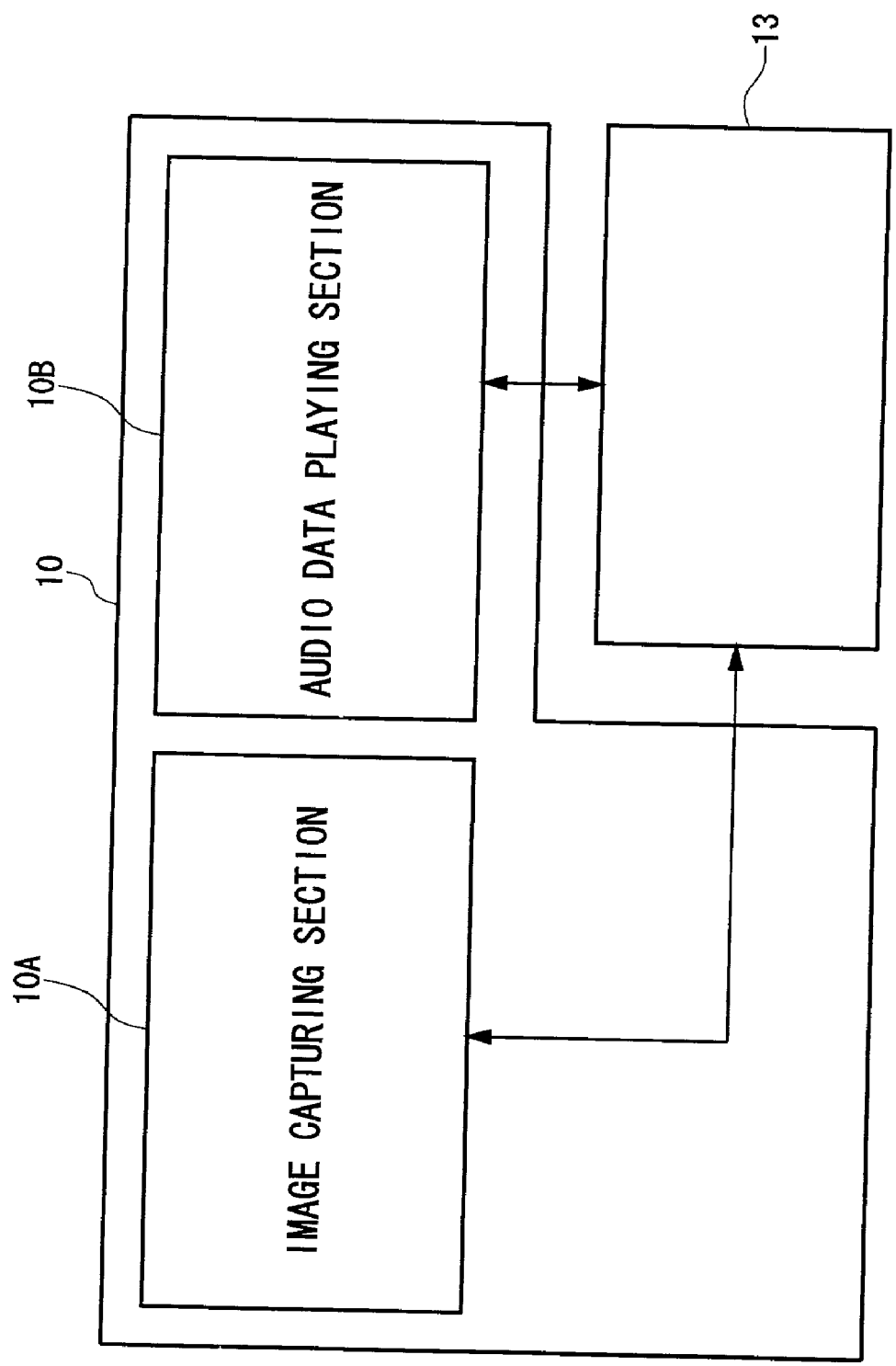
FIG. 11 is a functional diagram showing the functional structure of the portable multi-function apparatus and the controller.

FIG. 11 is a schematic functional diagram showing the functional structure of the portable multi-function apparatus 10 and the controller 13. The portable multi-function apparatus 10 includes the image capturing section 10A and the audio data playing section 10B. The image capturing section 10A undertakes the camera operation, and the audio data playing section 10B undertakes the audio operation. It is apparent from FIG. 11, both the camera operation and the audio operation are operated by the controller 13.

Figure 12:
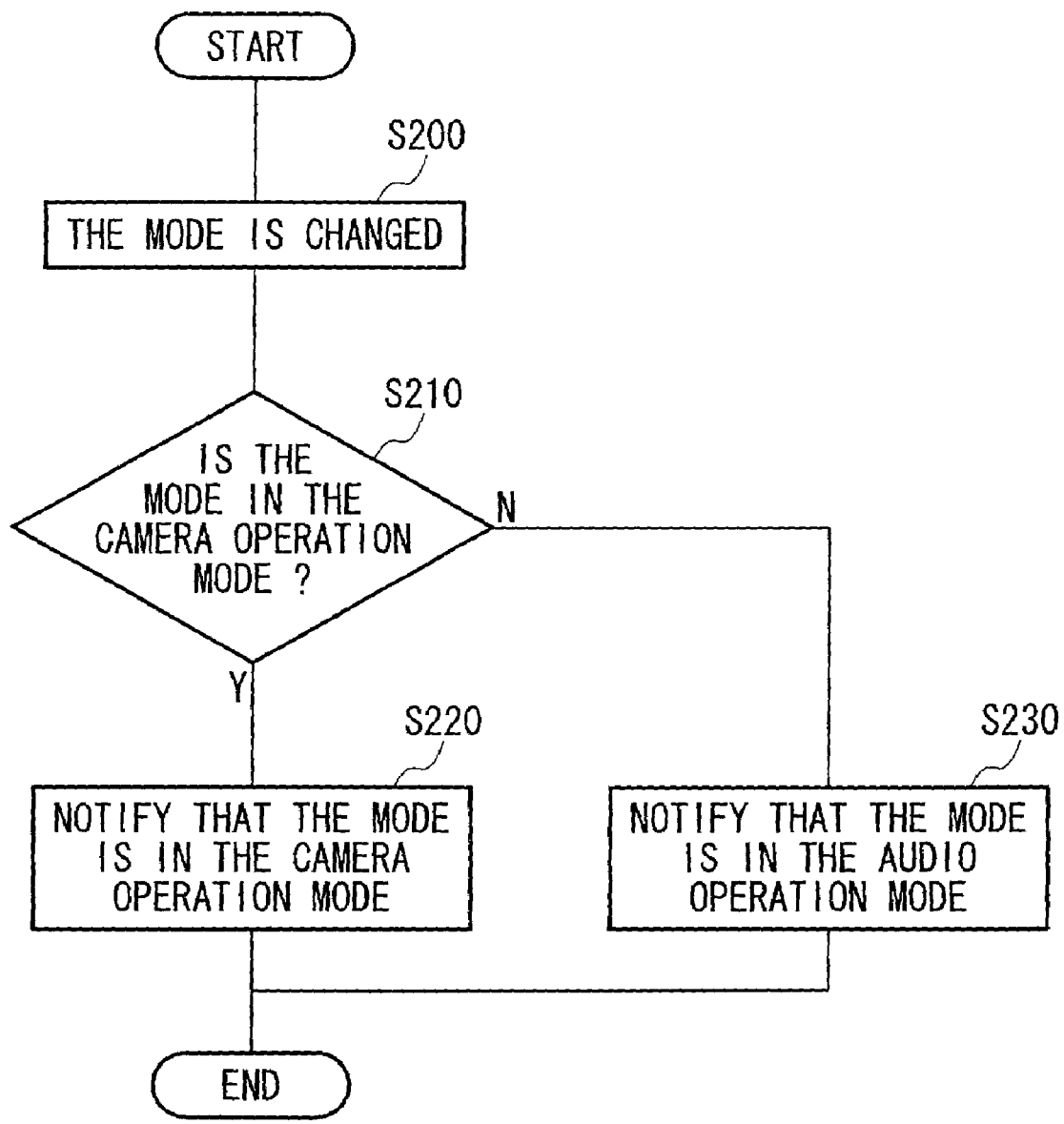
FIG. 12 is a flowchart showing the process of notifying a user the state of the mode of the portable multi-function apparatus.

FIG. 12 is a flowchart showing the process of notifying a user of the state of the current mode of the portable multi-function apparatus 10. When the mode of the portable multi-function apparatus 10 is changed at a step S200, the apparatus 10 detects whether the mode is in the camera operation mode at a step S210. If the mode is in the camera operation mode, the apparatus 10 notifies the user that the mode is in the camera operation mode at a step S220. If the mode is not in the camera operation mode, the apparatus 10 notifies the user that the mode is in the audio operation mode at a step S230. The various methods for notifying the user of the state of the mode may be employed depending on the requirement of each product, some of the examples have been described above, though.

Although the common operation member according to the present embodiment is used for a portable multi-function apparatus, which has the camera operation mode and the audio operation mode, it may also be used for a cellular phone and other electronic appliances.

As is obvious from the above-described descriptions, a portable multi-function apparatus that can control a camera operation and an audio operation by a compact operation member with excellent operability.

Although the present invention has been described by way of exemplary embodiments, it should be understood that those skilled in the art might make many changes and substitutions without departing from the spirit and the scope of the present invention which is defined only by the appended claims.

What is claimed is:

1. A portable multi-function apparatus having a camera operation mode and an audio operation mode with which at least a music data is operated, the apparatus comprising:
   a main body;
   an image capturing section in said main body operable in the camera operation mode, said image capturing section comprising an image recording part and a recorded image playback part;
   an audio data playing section in said main body operable in the audio operation mode; and
   a controller operatively connectable with said image capturing section and said music audio data playing section, said controller comprising at least one common operation member operable to perform a first function in the camera operation mode and a second function, different from said first function, in the audio operation mode,
   wherein said camera operation mode and said audio operation mode is automatically selected according to whether said controller is engaged with said main body or not.

2. The portable multi-function apparatus as claimed in claim 1, wherein said common operation member is a release switch operable as a shutter switch in said camera operation mode and as an audio operation switch in said audio operation mode.

3. The portable multi-function apparatus as claimed in claim 1, wherein said controller is attachable to said main body, said controller being positioned at an upper right corner of said main body, when viewed from a side of an ocular finder of said main body, when attached to said main body.

4. The portable multi-function apparatus as claimed in claim 1, wherein said controller is attachable to said main body, said common operation member of said controller being positioned at a top right position of said main body, when viewed from a side of a finder of said main body, and said common operation member being operable as a release switch for said camera operation mode when said controller is attached to said main body.

5. The portable multi-function apparatus as claimed in claim 1, wherein said controller is attachable to said main body at a position such that, when orientation of said main body is changed, said controller is operable with an operational posture that is same to an operational posture for said controller before said changed orientation of said main body.

6. The portable multi-function apparatus as claimed in claim 5, wherein said controller is attachable to said main body so as to be positioned at an upper right position, as viewed from a side of an ocular finder of said main body, when a picture is taken with a shorter side of said main body on top.

7. The portable multi-function apparatus as claimed in claim 1, wherein said controller is attachable to said main body and includes a headphone terminal, said headphone terminal being exposed on an outer surface of said controller when said controller is attached to said main body.

8. The portable multi-function apparatus as claimed in claim 1, wherein said main body includes a controller-detecting section for detecting a loading of said controller.

9. The portable multi-function apparatus as claimed in claim 8, wherein said controller automatically switches an operational mode to said camera operation mode when said controller-detecting section detects the loading of said controller, and said controller automatically switches said operational mode to said audio operation mode when said controller-detecting section does not detect the loading of said controller.

10. The portable multi-function apparatus as claimed in claim 8, wherein said controller switches to an exclusive use of said camera operation mode when said controller-detecting section detects the loading of said controller, and said controller switches to an exclusive use of said audio operation mode when said controller-detecting section does not detect the loading of said controller.

11. The portable multi-function apparatus as claimed in claim 1, wherein said controller is operatively connected with said image capturing section and said audio data playing section by a wireless connection.

12. The portable multi-function apparatus as claimed in claim 1, wherein said controller is operatively connected with said image capturing section and said audio data playing section by a cable connection.

13. A portable multi-function apparatus operable in a camera operation mode and an audio operation mode, the apparatus comprising:

a main body; and a controller operatively connectable with said main body for an audio operation and a camera operation thereof; wherein:

said main body includes a detachable first recording medium; and said controller includes a detachable second recording medium, wherein said camera operation mode and said audio operation mode is automatically selected according to whether said controller is engaged with said main body or not.

14. The portable multi-function apparatus as claimed in claim 13, wherein, if said second recording medium is loaded, said second recording medium is automatically selected and used when said controller is in an audio operation mode and, if said first recording medium is loaded, said first recording medium is automatically selected and used when said controller is in a camera operation mode.

15. The portable multi-function apparatus as claimed in claim 13, wherein data is transferable between said first recording medium and said second recording medium.

16. The portable multi-function apparatus as claimed in claim 13, wherein:

said main body includes a first battery and said controller includes a second battery; and said first battery charges said second battery with electricity when said controller is loaded on said main body.

17. A controller for operatively associating with a portable multi-function apparatus, which is operable in a camera operation mode and an audio operation mode, with which at least a music data is operated, the controller comprising:

at least one common operation member operable to perform a first function of the portable multi-function apparatus in the camera operation mode thereof and a second function of the multi-function apparatus, different from said first function, in the audio operation mode thereof; and an operation signal transmitting output connecting to said common operation member, wherein said camera operation mode and said audio operation mode is automatically selected according to whether said controller is engaged with said main body or not.

18. The controller according to claim 17, further comprising a first recording medium operable in the audio operation mode of the portable multi-function apparatus.

19. The controller according to claim 18, wherein said first recording medium communicates with a second recording medium installed in the multi-function apparatus to transfer data back and forth.

20. The controller according to claim 17, further comprising an engaging member, which is detachably engageable with the portable multi-function apparatus.

* * * * *